(12) United States Patent
Suzuki

(10) Patent No.: US 8,159,112 B2
(45) Date of Patent: Apr. 17, 2012

(54) POLYMERIC ACTUATOR CONTROLLER, POLYMERIC ACTUATOR CONTROL METHOD, AND ELECTRONIC APPARATUS

(75) Inventor: Kazuhiro Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 49 days.

(21) Appl. No.: 12/567,310

(22) Filed: Sep. 25, 2009

(65) Prior Publication Data

US 2010/0079032 A1 Apr. 1, 2010

(30) Foreign Application Priority Data

Sep. 29, 2008 (JP) ................................. 2008-250927

(51) Int. Cl.
*H01L 41/09* (2006.01)
*H02N 2/06* (2006.01)

(52) U.S. Cl. ....................................... 310/317; 310/800

(58) Field of Classification Search .................. 310/317, 310/800

See application file for complete search history.

(56) References Cited

U.S. PATENT DOCUMENTS

| 6,285,115 | B1 * | 9/2001 | Gallmeyer et al. | 310/317 |
| 2005/0052095 | A1 * | 3/2005 | Kasai et al. | 310/317 |
| 2006/0113880 | A1 * | 6/2006 | Pei et al. | 310/800 |

FOREIGN PATENT DOCUMENTS

| JP | 06-062585 | * | 3/1994 |
| JP | 2006-293008 | | 10/2006 |

OTHER PUBLICATIONS

Machine translation of JP 06-062585 provided by the website of the Japanese Patent Office.*

* cited by examiner

*Primary Examiner* — Derek Rosenau
(74) *Attorney, Agent, or Firm* — SNR Denton US LLP

(57) ABSTRACT

A polymeric actuator controller includes: a polymeric actuator that has a first electrode and a second electrode for applying electric energy to a polymeric portion and that displaces in accordance with applied electric energy; a potential difference reading unit that reads a potential difference that occurs between terminals of the first electrode and second electrode of the polymeric actuator; and a polymeric actuator driver circuit that applies the electric energy to the first electrode and second electrode of the polymeric actuator to drive the polymeric actuator. The polymeric actuator driver circuit and the potential difference reading unit form a closed loop. The polymeric actuator driver circuit varies the electric energy so that the potential difference read by the potential difference reading unit is maintained at a target potential value.

11 Claims, 9 Drawing Sheets

FIG. 6

| CONTROL COMMAND | |
|---|---|
| ·Go-to-Inf-Position | |
| | ➢ MOVE TO INFINITE POSITION |
| ·Go-to-Macro, xx step | |
| | ➢ MOVE xx STEP TOWARD MACRO |
| | ➢ STEP IS NUMBER OF STEPS WHERE INFINITE POSITION IS 0 AND POSITION THAT SUFFICIENTLY EXCEEDS MACRO POSITION IS 1024 |
| ·Go-to-Inf, xx step | |
| | ➢ MOVE xx STEP TOWARD INFINITE DISTANCE |
| 1. Go-to-Home-Position | |
| | ➢ MOVE TO HOME POSITION |

POLYMERIC ACTUATOR CONTROLLER, POLYMERIC ACTUATOR CONTROL METHOD, AND ELECTRONIC APPARATUS

BACKGROUND OF THE INVENTION

1. Field of the Invention

The invention relates to a polymeric actuator controller and polymeric actuator control method that control a displacement of a polymeric actuator, and an electronic apparatus that includes the polymeric actuator controller.

2. Description of the Related Art

A polymeric actuator is formed from a polymeric material or a composite of a polymeric material. The polymeric actuator is an actuator that converts energy supplied from a power source thereof into deformation energy of the material itself to deform. A typical power source is electric energy.

The above polymeric actuator may be applied to various electronic apparatuses. Japanese Unexamined Patent Application Publication No. 2006-293008 suggests an optical device that employs the polymeric actuator.

FIG. 1 is a view for illustrating the principle of the function of the polymeric actuator.

One end of the polymeric actuator 1 is fixed, and the other end side is a free end. The polymeric actuator 1 includes a wet ion-exchange membrane 2 and electrodes 3 and 4. The ion-exchange membrane 2 serves as a polymeric portion. The electrodes 3 and 4 are arranged on both sides of the ion-exchange membrane 2 along the longitudinal direction of the ion-exchange membrane 2.

As shown in FIG. 1, when the polymeric actuator 1 that bends by a voltage supplied thereto is used, a voltage or an electric current is applied to both electrodes 3 and 4 to cause the polymeric actuator 1 to bend.

SUMMARY OF THE INVENTION

However, the relationship between a voltage value or an electric current value, applied to the polymeric actuator 1, and a displacement is complicated. Even when a constant voltage is applied to the polymeric actuator 1, the displacement varies over time. As the applied voltage is stopped, the displacement of the polymeric actuator 1 is basically held but it slightly returns. In addition, the displacement of the polymeric actuator 1 gradually varies over time, and the displacement does not immediately become zero even when both electrode terminals are short-circuited.

FIG. 2 is a view that shows a configuration example of a typical polymeric actuator controller. The polymeric actuator controller 10 shown in FIG. 2 includes an actuator driving circuit 5 and a movable portion 6. The actuator driving circuit 5 controls a voltage applied to the electrodes 3 and 4. The movable portion 6 is attached to the free end side of the polymeric actuator 1.

However, the polymeric actuator controller 10 has the following disadvantages. There is no method to determine how much the polymeric actuator 1 is currently bent or whether the polymeric actuator 1 is straight. As the polymeric actuator 1 is displaced by a certain amount or more, it may adversely affect the polymeric actuator 1. However, there is no method to determine how much the current degree of bending is, so it is difficult to determine whether the degree of bending falls within a safety range. In addition, there is no method to hold a displacement at a desired position.

In order to accurately control the displacement, there is a technique that a magnet 7 is arranged at the movable portion 6 and a position sensor 8 formed of a Hall element is provided near the magnet 7 as shown in FIG. 3, the current state of the polymeric actuator 1 is determined on the basis of the output from the position sensor 8, and then the state is considered to control an applied voltage or an electric current, thus controlling the position.

However, the problem in this case is that the cost of the magnet, Hall element, and the like, as the position sensor increases. It is necessary to attach the magnet or the Hall element to the movable portion, so the weight of the movable portion increases. This makes it disadvantageous to drive the movable portion by the polymeric actuator. The size increases due to the magnet and the Hall element, and it is disadvantageous as a small actuator. It is necessary to consider the influence of a magnetic field on the surroundings due to the magnet.

It is desirable to provide a polymeric actuator controller, polymeric actuator control method and electronic apparatus that are able to identify the current state of an actuator without using a position sensor, or the like, and that are able to maintain a constant displacement.

According to a first embodiment of the invention, a polymeric actuator controller includes: a polymeric actuator that has a first electrode and a second electrode for applying electric energy to a polymeric portion and that displaces in accordance with applied electric energy; a potential difference reading unit that reads a potential difference that occurs between terminals of the first electrode and second electrode of the polymeric actuator; and a polymeric actuator driver circuit that applies the electric energy to the first electrode and second electrode of the polymeric actuator to drive the polymeric actuator, wherein the polymeric actuator driver circuit and the potential difference reading unit form a closed loop, and the polymeric actuator driver circuit varies the electric energy so that the potential difference read by the potential difference reading unit is maintained at a target potential value.

According to a second embodiment of the invention, a polymeric actuator control method includes the steps of: applying electric energy to a first electrode and a second electrode for applying the electric energy to a polymeric portion of a polymeric actuator; reading a potential difference that occurs between terminals of the first electrode and second electrode of the polymeric actuator; and varying the electric energy so as to maintain the read potential difference at a target potential value.

According to a third embodiment of the invention, an electronic apparatus includes: a movement control target portion; and a polymeric actuator controller that controls movement of the movement control target portion by a displacement of a polymeric actuator, wherein the polymeric actuator controller includes the polymeric actuator that has a first electrode and a second electrode for applying electric energy to a polymeric portion and that displaces in accordance with applied electric energy; a potential difference reading unit that reads a potential difference that occurs between terminals of the first electrode and second electrode of the polymeric actuator; and a polymeric actuator driver circuit that applies the electric energy to the first electrode and second electrode of the polymeric actuator to drive the polymeric actuator, wherein the polymeric actuator driver circuit and the potential difference reading unit form a closed loop, and the polymeric actuator driver circuit varies the electric energy so that the potential difference read by the potential difference reading unit is maintained at a target potential value.

According to the embodiments of the invention, the polymeric actuator driver circuit applies electric energy to the first electrode and the second electrode for applying the electric energy to the polymeric portion of the polymeric actuator. Then, the potential difference reading unit reads a potential difference that occurs between the terminals of the first electrode and second electrode of the polymeric actuator, and supplies the potential difference to the polymeric actuator driver circuit. The polymeric actuator driver circuit varies electric energy so that the read potential difference is maintained at a target potential value.

According to the embodiments of the invention, it is possible to identify the current state of an actuator without using a position sensor, or the like, and it is possible to maintain a constant displacement.

BRIEF DESCRIPTION OF THE DRAWINGS

FIG. 6 is a view that shows examples of control commands given to the polymeric actuator driver circuit from a CPU;

DESCRIPTION OF THE PREFERRED EMBODIMENTS

Hereinafter, embodiments of the invention will be described with reference to the accompanying drawings. Note that the description will be made in the following order.
1. First Embodiment (configuration example of a camera that uses a polymeric actuator controller)
2. Second Embodiment (another configuration example of a camera that uses a polymeric actuator controller)

First Embodiment

Figure 1:
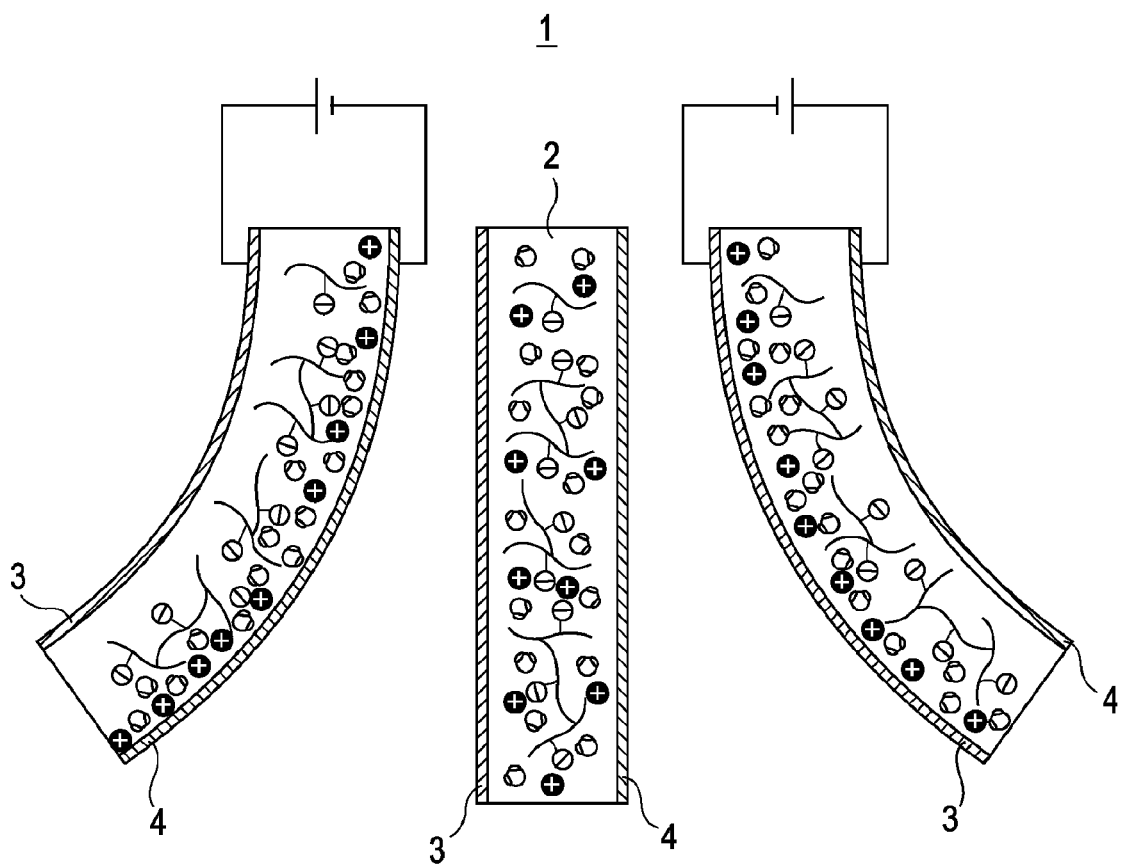
FIG. 1 is a view for illustrating the principle of the function of a polymeric actuator.
Figure 2:
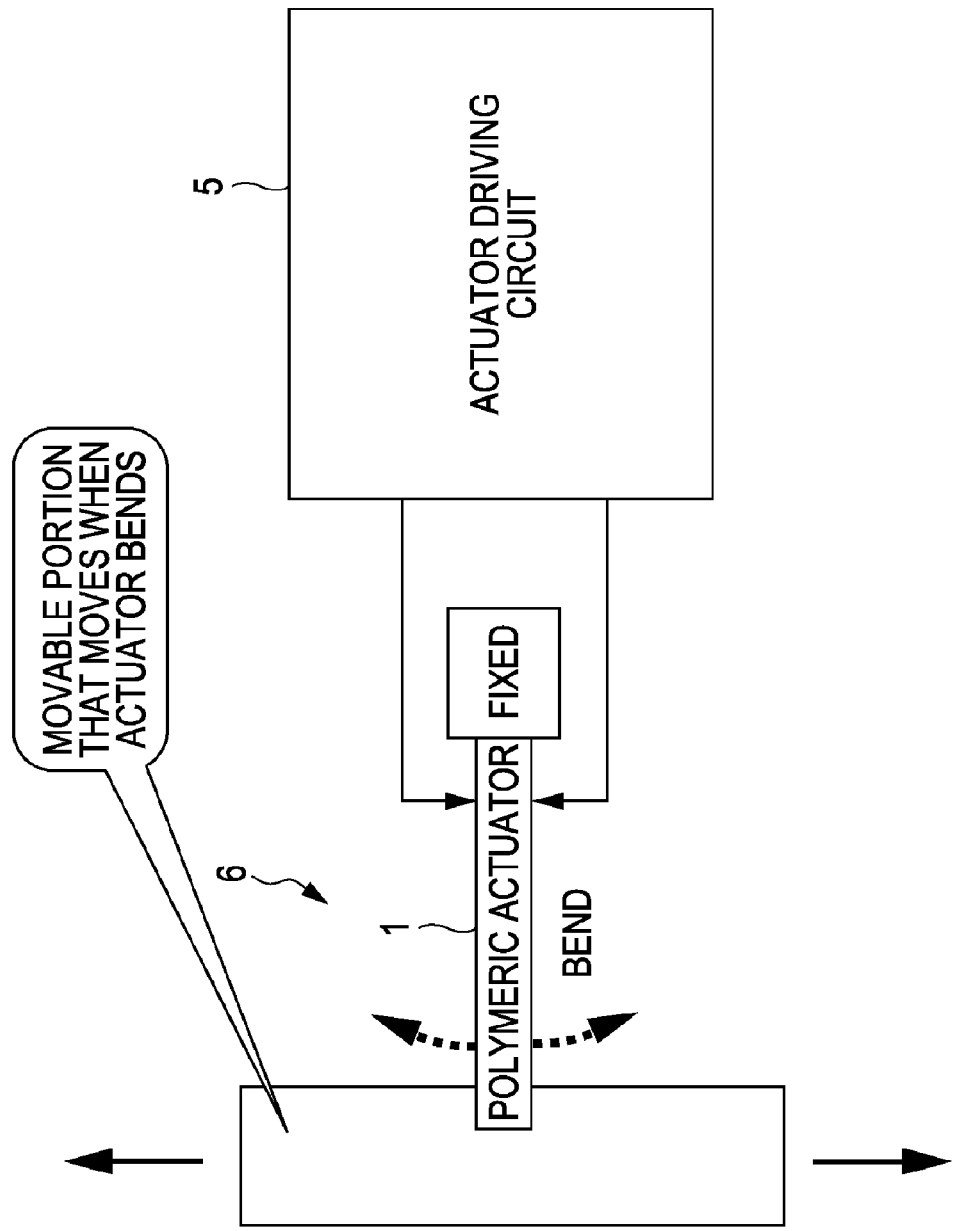
FIG. 2 is a view that shows a configuration example of a typical polymeric actuator controller.
Figure 3:
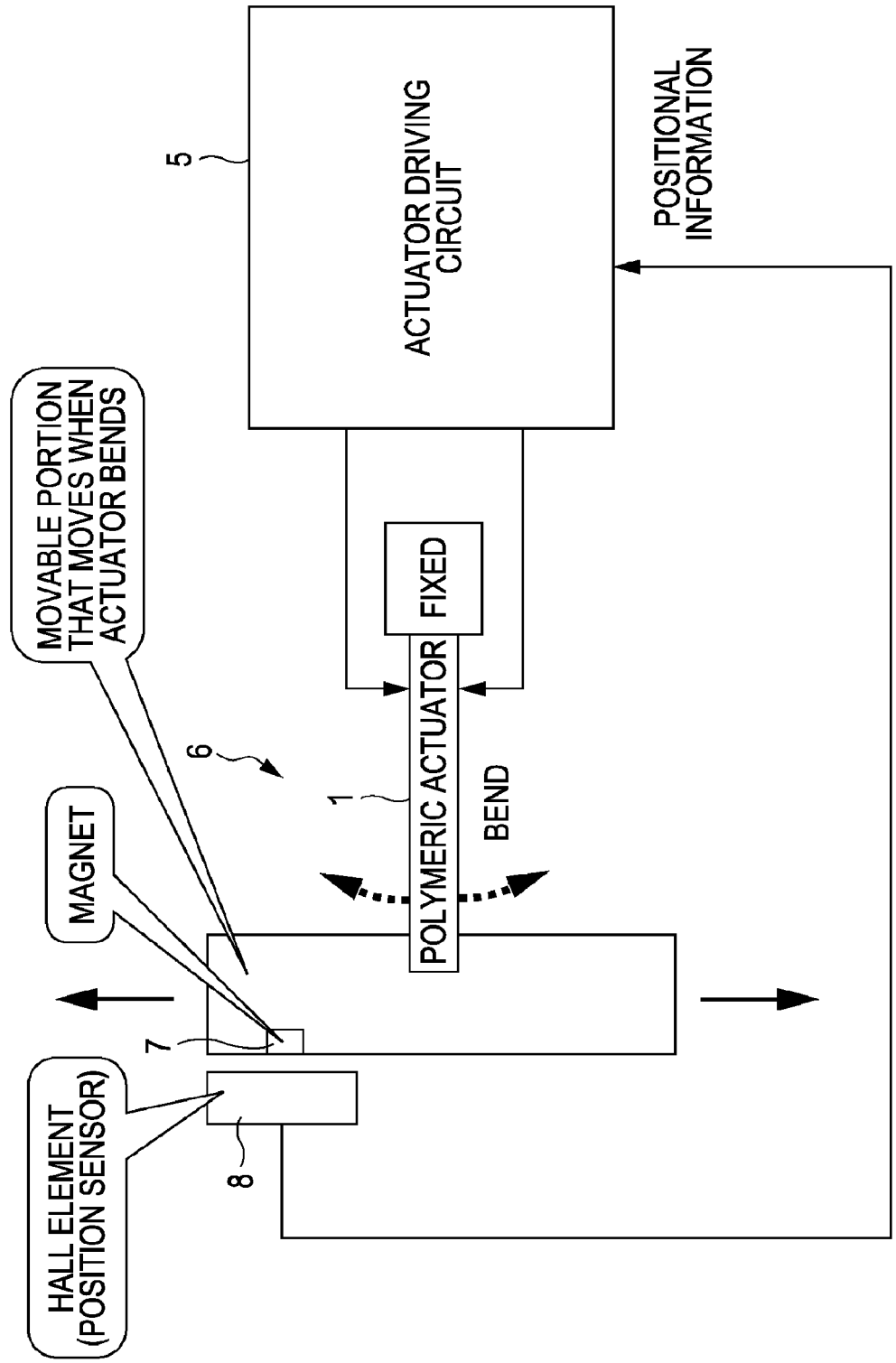
FIG. 3 is a view that shows a configuration example in which a position sensor is provided for the polymeric actuator controller shown in FIG. 2.
Figure 4:
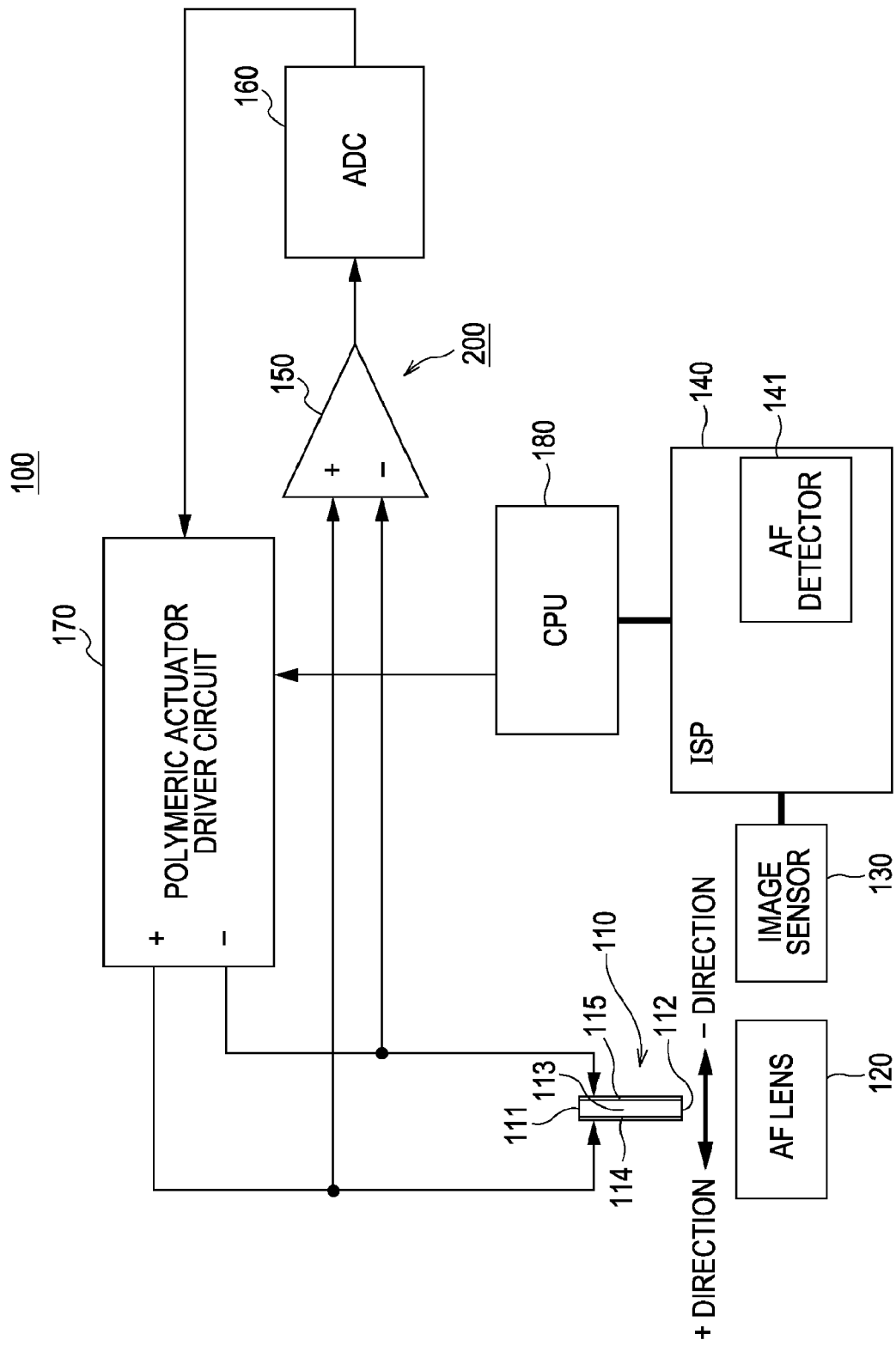
FIG. 4 is a view that shows a configuration example of an image pickup apparatus that employs a polymeric actuator controller according to a first embodiment of the invention.

FIG. 4 is a view that shows a configuration example of an image pickup apparatus that employs a polymeric actuator controller according to a first embodiment of the invention.

In the present embodiment, an example in which a polymeric actuator is used as a lens driving device for AF (Auto focus) in a small camera module as an electronic apparatus, such as a cellular phone, will be described. A movement control target portion in the electronic apparatus according to the first embodiment is an AF lens. Configuration of Image Pickup Apparatus An image pickup apparatus 100 includes a polymeric actuator 110, a lens system 120 that has an auto focus (AF) function, an imaging device 130 and an image signal processing unit (ISP: Image Signal Processor) 140. Furthermore, the image pickup apparatus 100 includes an error amplifier 150, an analog-digital converter 160, a polymeric actuator driver circuit 170 and a CPU 180, which serves as a control unit.

Then, the error amplifier 150, the ADC 160, the polymeric actuator driver circuit 170 and the CPU 180 form a polymeric actuator controller 200 according to the present embodiment. In addition, the error amplifier 150 and the ADC 160 form a potential difference reading unit. In addition, the error amplifier 150, the ADC 160 and the polymeric actuator driver circuit 170 form a closed loop.

One end portion 111 of the polymeric actuator 110 is fixed, and the other end 112 side is a free end 112. The free end 112 is attached to a movable portion of an AF lens (not shown) of the lens system 120. The polymeric actuator 110 includes a wet ion-exchange membrane 113 and a first electrode 114 and a second electrode 115. The ion-exchange membrane 113 serves as a polymeric portion. The first electrode 114 and the second electrode 115 are arranged on both sides of the ion-exchange membrane 113 along the longitudinal direction of the ion-exchange membrane 113. A voltage is applied to the first electrode 114 and the second electrode 115 of the polymeric actuator 110 from the polymeric actuator driver circuit 170.

Note that in the present embodiment, a fluorine-based ion-exchange resin may be used as a polymer. The ion-exchange membrane is typically Nafion produced by Du Pont or Flemion produced by Asahi Glass Co., Ltd. In addition, gold or platinum is used for the first electrode 114 and the second electrode 115.

The lens system 120 forms a subject image on an imaging surface of the imaging device 130. The lens system 120 includes an AF lens. The focus of the lens system 120 is controlled by the polymeric actuator 110 that is displaced with a voltage applied from the polymeric actuator driver circuit 170 in accordance with control executed by the CPU 180.

A subject image is formed on the imaging surface of the imaging device 130 through an AF optical system 120. The imaging device 130 generates an electric signal corresponding to the amount of light forming the image, and then outputs the electric signal to the image signal processing unit 140. The imaging device 130 is formed of a CMOS image sensor or a CCD.

The image signal processing unit (ISP) 140 controls a process, such as demosaic, auto exposure and auto white balance, on the image data supplied from the imaging device 130. The image signal processing unit 140 includes an AF detector 141. The AF detector 141 calculates the contrast value of an image from the luminance information of the image data, and outputs the result to the CPU 180 as a signal S140T. As will be described later, the CPU 180 uses the contrast value as an index and controls the AF lens through the polymeric actuator 110 so as to increase the contrast value to adjust the focus.

The error amplifier 150 reads a potential difference between both terminals of the polymeric actuator 110, that is, a potential difference that occurs between the first electrode 114 and the second electrode 115, and then outputs a differential signal S150 to the ADC 160.

The ADC 160 converts the differential signal S150 supplied from the error amplifier 150 from an analog signal into a digital signal, and outputs the digital signal to the polymeric actuator driver circuit 170.

The polymeric actuator driver circuit 170 varies a voltage value so that a potential value given by the digital value from the ADC 160, that is, a potential difference between both terminals of the polymeric actuator 110, is maintained at a target potential value, and then applies the voltage value to the polymeric actuator 110. Note that, here, a voltage applied to the polymeric actuator 110 is varied in the above description; instead, it may be configured to vary an electric current value or an electric power value.

In order to execute control to vary the voltage value, electric current value or electric power value, in the present embodiment, the closed loop is formed of the polymeric actuator driver circuit 170, the error amplifier 150 and the ADC 160. The polymeric actuator driver circuit 170 converts a parameter value given from the CPU 180, which is the outside of the loop, into a target potential value, and varies the target potential value in accordance with a command to generate a voltage applied so as to vary a displacement of the polymeric actuator.

When the polymeric actuator 110 is not used, the polymeric actuator driver circuit 170, under the control of the CPU 180, sets the voltage between both terminals at zero to drive the polymeric actuator 110 so as not to cause damage to the polymeric actuator 110. The polymeric actuator driver circuit 170, under the control of the CPU 180, limits the target voltage value, into which the given parameter value has been converted, within a proper operation guarantee range, thus driving the polymeric actuator 110 so as not to cause damage to the polymeric actuator 110.

Figure 5:
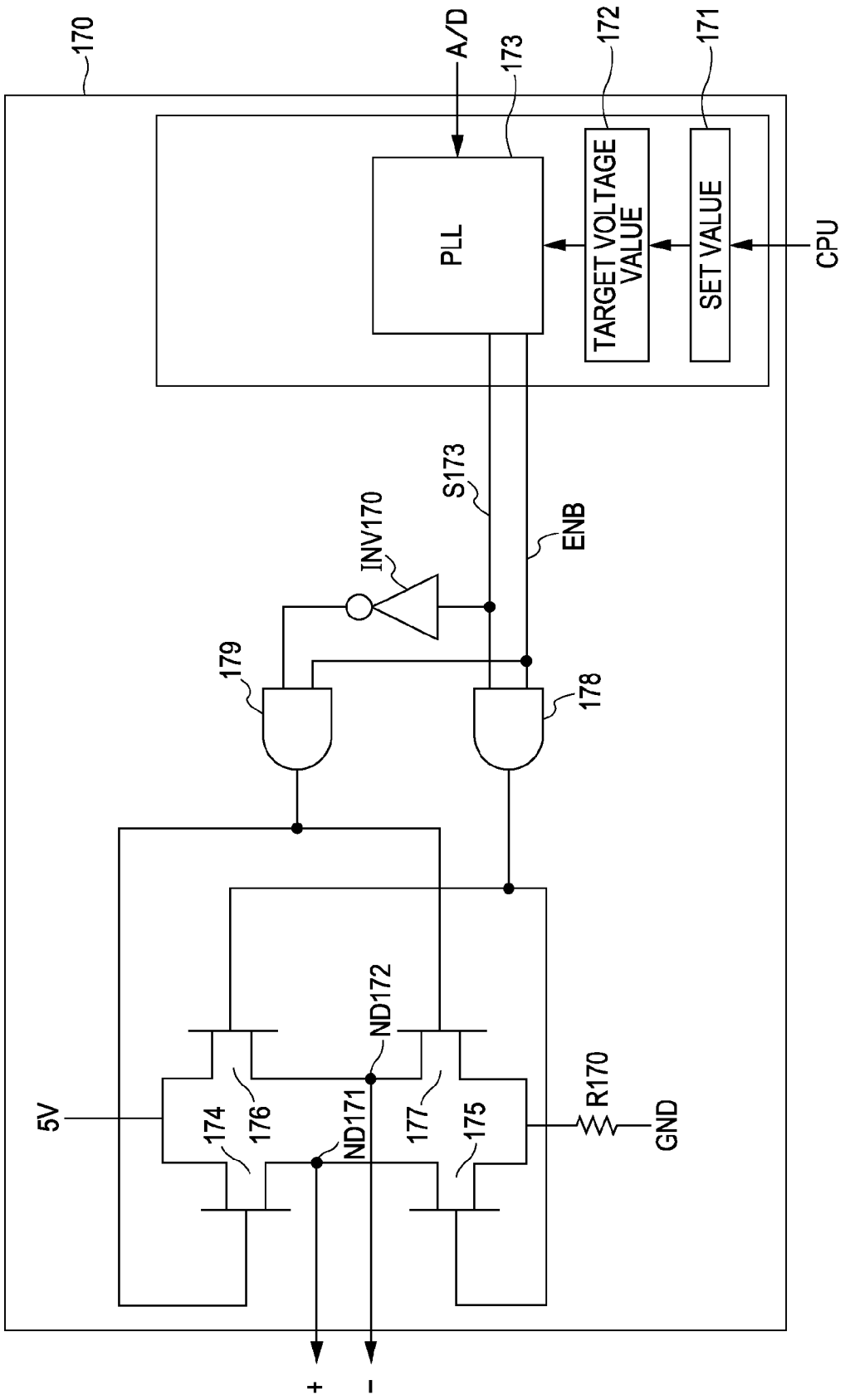
FIG. 5 is a view that shows a configuration example of a polymeric actuator driver circuit according to the present embodiment.

FIG. 5 is a view that shows a configuration example of the polymeric actuator driver circuit 170 according to the present embodiment.

The polymeric actuator driver circuit 170 shown in FIG. 5 includes a set value register 171, a target voltage value register 172, a PLL circuit 173, transistor switches 174 to 177, AND circuits 178 and 179, an inverter INV170 and a resistor R170.

The parameter given from the CPU 180 is set for the set value register 171. The target voltage value converted from the parameter value set for the set value register 171 is set for the target voltage value register 172.

The PLL circuit 173 generates a pulse signal S173 that is PWM-modulated so as to have a potential difference between the terminals of the polymeric actuator 110 from the ADC 160 at an oscillatory frequency corresponding to the target voltage value at a predetermined duty. The pulse signal S173 generated by the PLL circuit 173 is supplied to one of inputs of the AND circuit 178 and also to one of inputs of the AND circuit 179 through the inverter INV170. In addition, the PLL circuit 173, under the control of the CPU 180, for example, generates a high-level active enable signal (Enable) ENB. The enable signal ENB is supplied to the other one of inputs of the AND circuit 178 and the other one of inputs of the AND circuit 179.

The transistor switch 174 is, for example, formed of an insulated-gate field-effect transistor (FET). The transistor switches 174 and 175 are connected in series between a power source voltage, for example, a 5V supply line, and one end of the resistor R170. Similarly, the transistor switches 176 and 177 are connected in series between the power supply voltage, for example, the 5V supply line, and the one end of the resistor R170. Then, the other end of the resistor R170 is connected to a ground potential source GND.

A node ND171 is formed of a connecting point between the transistor switches 174 and 175. The node ND171 is connected to the first electrode 114 of the polymeric actuator 110 as a positive terminal. A node ND172 is formed of a connecting point between the transistor switches 176 and 177. The node ND172 is connected to the second electrode 115 of the polymeric actuator 110 as a negative terminal. In addition, the positive terminal is connected to a noninverting input terminal (+) of the error amplifier 150, and the negative terminal is connected to an inverting input terminal (−) of the error amplifier 150.

The gates of the transistor switches 174 and 177 are connected to the output of the AND circuit 179. The gates of the transistor switches 175 and 176 are connected to the output of the AND circuit 178.

The thus configured polymeric actuator driver circuit 170 has the following function. The polymeric actuator driver circuit 170 shown in FIG. 4 alternately switches the transistor switches with a rectangular wave that oscillates at a certain frequency (for example, 1 kHz) to flow electric current to the polymeric actuator 110 in the positive direction and in the negative direction in order to drive the polymeric actuator 110. Then, the polymeric actuator driver circuit 170 changes a rectangular-wave duty to control a displacement of the polymeric actuator 110.

In this way, a signal having a different duty is supplied to the polymeric actuator 110, so the polymeric actuator 110 changes its displacement in such a manner that electric charge accumulates at one side by a difference between forward and reverse duties. The driving of the polymeric actuator driver circuit 170 is enabled when the enable signal ENB is at a high level (H), and, when the enable signal ENB is at a low level (L), all the four transistor switches 174 to 177 are turned off and then both terminals of the polymeric actuator 110 is open. The enable signal ENB repeats H and L at a certain interval. When the enable signal ENB is at L, a voltage between the terminals of the polymeric actuator 110 is measured by the ADC 160. When the enable signal ENB is at H, electric current supplied to the transistor switches 174 to 177 is turned on or off in accordance with duty to apply a desired driving voltage to the polymeric actuator 110.

The polymeric actuator driver circuit 170 carries out the above described drive control in accordance with a control command CMD from the CPU 180.

FIG. 6 is a view that shows examples of control commands given to the polymeric actuator driver circuit from the CPU.

An infinite position in Go-to-Inf-Position command is the position of a lens when a subject is located at an infinite distance. The AF lens is configured so that the polymeric actuator 110 is sufficiently bent in the negative direction to contact a mechanical stopper at the infinite distance. Thus, as the above command is issued, the polymeric actuator driver circuit 170 sets the target voltage at a minimum value.

In the present embodiment, the range of the target voltage value is designed so that, as the target voltage value is varied from −3 V to 3 V, the polymeric actuator 110 moves the AF lens to sufficiently cover the range from the infinite distance to a macro position. The CPU 180 manages the moving range so as to correspond to the number of steps from "0" to "1023". Actually, the range of 6 V from −3 V to 3 V corresponds to 1024 steps, so one step corresponds to 5.9 mV.

As the CPU 180 sends a command CMD to the polymeric actuator driver circuit 170 using the number of steps, the polymeric actuator driver circuit 170 converts the number of steps into a target voltage value. The polymeric actuator driver circuit 170 is supplied from the ADC 160 with the value of a voltage between both terminals measured at the time when the enable signal ENB is at L at which the polymeric actuator driver circuit 170 is not driving the polymeric actuator 110. The polymeric actuator driver circuit 170 drives the polymeric actuator 110 by setting the enable signal ENB at H so that the duty of PWM is changed in accordance with the magnitude of a difference from the target voltage value to decrease the difference to zero. In the present embodiment, the polymeric actuator driver circuit 170 carries out the above described closed loop control so that a difference from the target voltage value is constantly maintained at zero by repeating the above operation.

As the Go-to-Inf-Position command is issued from the CPU 180, the polymeric actuator driver circuit 170 sets the target voltage value at −3 V and carries out closed loop control so as to attain the set target voltage value.

When the Go-to-Macro command is issued from the CPU 180, the polymeric actuator driver circuit 170 converts the number of steps sent in the command CMD on the basis of 5.9 mV/step and then adds the converted value to the target voltage value.

When the Go-to-Inf command is issued from the CPU 180, the polymeric actuator driver circuit 170 converts the number of steps sent in the command CMD on the basis of 5.9 mV/step and subtracts the converted value from the target voltage value.

When the Go-to-Home-Position command is issued from the CPU 180, the polymeric actuator driver circuit 170 sets the target voltage value at 0.

The CPU 180 operates the AF lens using the above commands CMD. A target voltage value is not necessarily accurately proportional to a displacement of the polymeric actuator 110; however, there is a correlation despite a certain error, so the voltage value may be used as an index of the displacement.

Figure 7:
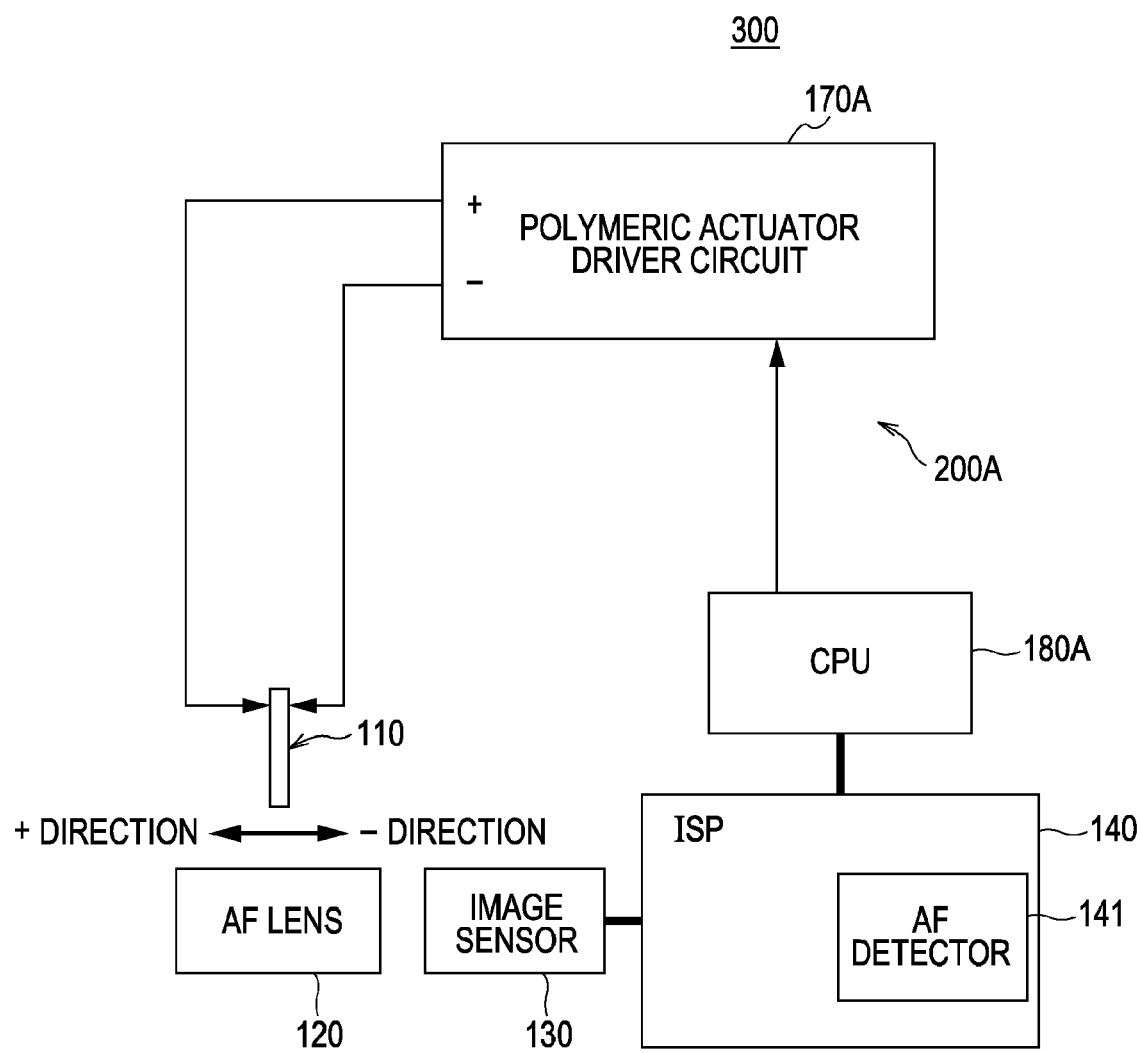
FIG. 7 is a view that shows a configuration example of an image pickup apparatus that includes a polymeric actuator controller that does not execute closed loop control as a comparative example.

FIG. 7 shows a configuration example of an image pickup apparatus 300 that includes a polymeric actuator controller 200A that does not execute closed loop control as a comparative example.

In the image pickup apparatus 300, as the command for moving the AF lens from the CPU 180A to the polymeric actuator driver circuit 170A is issued, the amount of movement or the moving position is converted into application of a constant voltage or a constant electric current for a certain duration on the basis of the amount of movement or the moving position and then executed. In this case, it is necessary that the relationship that how much the polymeric actuator 110 bends at what magnitude of voltage and electric current for how long the voltage and electric current are applied is clear. However, in the polymeric actuator 110, the above relationship is complex and is not modeled, so the accuracy of control is remarkably poor. In other words, in the image pickup apparatus 300 shown in FIG. 7, the voltage value or current value is simply applied for its duration being varied in order to move the polymeric actuator, and there is no method to recognize how much the resultant displacement is. Alternatively, even when the applied voltage value or current value and the application duration are used as indices, the displacement gradually varies depending on a duration applied at the same voltage value and current value, and the displacement also varies over time even when the application is stopped. Therefore, they are not useful as indices.

In contrast, in the image pickup apparatus 100 according to the present embodiment, a potential generated by the polymeric actuator 110 is used as an index of its displacement, and a voltage and an electric current are constantly controlled to be adjusted to maintain the potential at a constant value, thus increasing the correlation with the displacement as the index. The control method that changes a target voltage to vary the displacement has a correlation with a displacement, so it holds.

Figure 8:
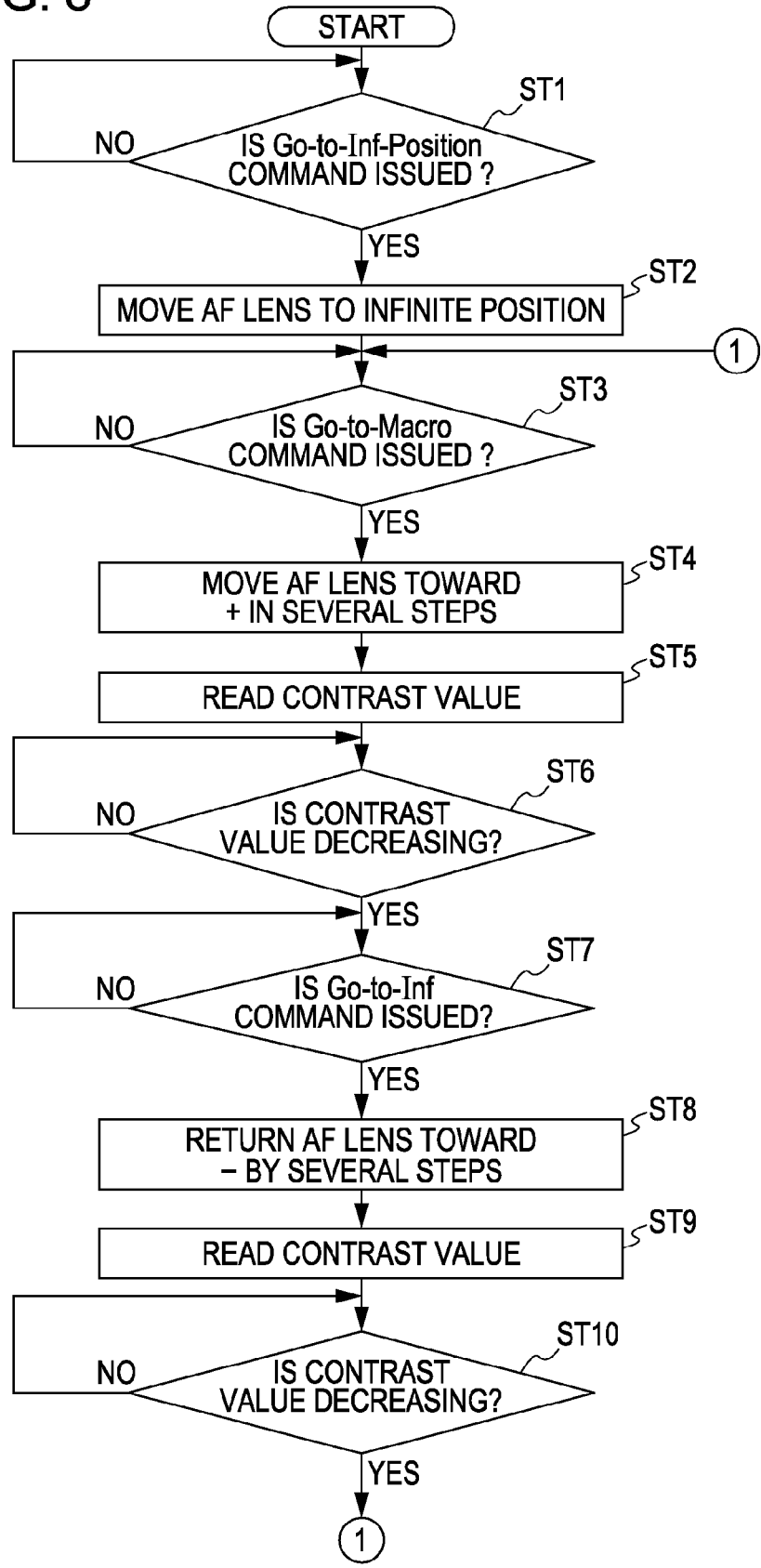
FIG. 8 is a flowchart for illustrating AF control operation in the image pickup apparatus according to the present embodiment.

An example in which AF is carried out using the above control method will be described. FIG. 8 is a flowchart for illustrating AF control operation in the image pickup apparatus according to the present embodiment.

Step ST1
In step ST1, the CPU 180 first issues the Go-to-Inf-Position command.

Step ST2
In step ST2, as the Go-to-Inf-Position command is issued from the CPU 180, the polymeric actuator driver circuit 170 sets the target voltage value at −3 V and carries out closed loop control so as to attain the target voltage value, thus moving the AF lens to the infinite (Inf) position.

Step ST3
In step ST3, the CPU 180 issues the Go-to-Macro command.

Step ST4
In step ST4, as the Go-to-Macro command is issued from the CPU 180, the polymeric actuator driver circuit 170 converts the number of steps sent in the command CMD on the basis of 5.9 mV/step and then adds the converted value to the target voltage value. By so doing, the polymeric actuator driver circuit 170 moves the AF lens toward the positive side in the number of steps.

Step ST5
In step ST5, image data formed by the imaging device 130 through the lens system 120 and are converted into an electrical signal are input to the image signal processing unit 140. In the image signal processing unit 140, the contrast value is calculated by the AF detector 141, and the CPU 180 reads the contrast value.

Step ST6
In step ST6, the CPU 180 determines whether the contrast value starts to decrease. In step ST6, when the contrast value starts to decrease, the process proceeds to the next step ST7.

Step ST7
In step ST7, when the contrast value starts to decrease, it is determined that a focal point has been passed and the CPU 180 issues the Go-to-Inf command.

Step ST8
In step ST8, when the Go-to-Inf command is issued from the CPU 180, the polymeric actuator driver circuit 170 converts the number of steps sent in the command CMD on the basis of 5.9 mV/step and subtracts the converted value from the target voltage value. By so doing, the polymeric actuator driver circuit 170 moves the AF lens toward the negative side in the number of steps to return several steps.

Step ST9
In step ST9, image data formed by the imaging device 130 through the lens system 120 and are converted into an electrical signal are input to the image signal processing unit 140. In the image signal processing unit 140, the contrast value is calculated by the AF detector 141, and the CPU 180 reads the contrast value.

Step ST10
In step ST10, the contrast value increases, but the contrast value starts to decrease when exceeding the focal point. Then, the CPU 180 determines whether the contrast value starts to decrease.

When the contrast value starts to decrease, the moving direction is changed again to repeat the same operation. That is, by repeating the processes similar to the processes in step ST3 to step ST10, it is possible to adjust the focus following a subject when the subject moves and a distance to the subject varies. Alternatively, when movement is stopped at a certain time point, it is possible to fix the position of the AF lens. The polymeric actuator driver circuit 170 continues to carry out control during then so as to constantly attain the set target value.

As the AF lens is moved forward or backward to track the subject in this manner, if there is no limitations, a voltage and an electric current are applied to the polymeric actuator 110 more than necessary to break the polymeric actuator 110 or forcibly bend even when it is not flexible, so it may damage the polymeric actuator 110. However, in the present embodiment, in the polymeric actuator driver circuit 170, when the number of steps is converted into a voltage value to obtain a target voltage value, limitation is imposed so as not to exceed ±3 V. Therefore, such a situation does not occur. If the limit value, such as ±3 V, varies because of a variation over time, it is possible to change the control range in accordance with that.

In addition, when the AF operation ends, if the voltage of the polymeric actuator 110 is set at 0 V by the Go-to-Home-Position command and then the AF operation is ended, it is possible to end the polymeric actuator 110 without imposing a load on the polymeric actuator 110. If the above process is not performed, the AF operation ends while the polymeric actuator 110 is bent. This may cause a deformation of the shape. In the existing method, both terminals are short-circuited; however, it is difficult to set a terminal voltage to 0 for a short period of time using this method. Thus, as in the case of the present manner, it is necessary to apply an electric current so that the voltage value becomes 0 V while monitoring the voltage value.

Other than the above, the control algorithm of the AF lens, for example, includes a method in which the contrast value is measured at predetermined intervals within the all range from the infinite (Inf) position to the macro (Macro), the target voltage value at a position at which the contrast value is maximum is memorized, and then finally the AF lens is moved to there in a stroke. In the polymeric actuator, there is a correlation between a voltage value and a displacement; however, accuracy and reproducibility are not high. Therefore, this correlation does not guarantee adjustment of a focal point, so it is necessary to carry out a process of looking for the peak of the contrast value again near a position after the movement.

Other than the above, there are various methods for algorithm of AF, so the embodiment of the invention is similarly effective to any methods.

Second Embodiment

Figure 9:
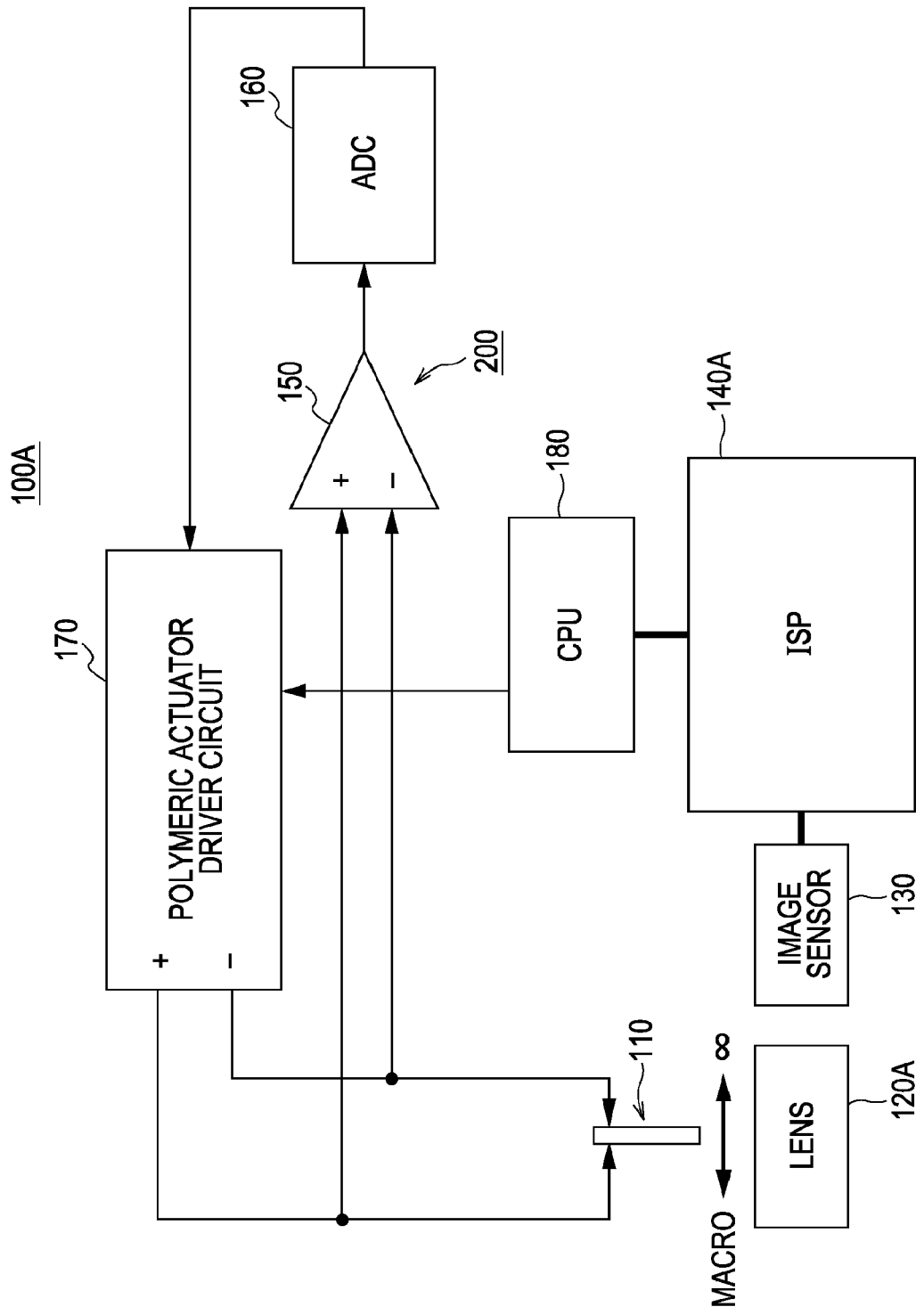
FIG. 9 is a view that shows a configuration example of an image pickup apparatus that employs a polymeric actuator controller according to a second embodiment of the invention.

FIG. 9 is a view that shows a configuration example of an image pickup apparatus that employs a polymeric actuator controller according to a second embodiment of the invention.

The image pickup apparatus 100A according to the second embodiment describes an example in which the polymeric actuator 110 is applied to switch between two focal points of a camera, that is, an infinite distance and a macro photography. A movement control target portion according to the second embodiment is a portion that switches between two focal points of the camera, that is, an infinite distance and a macro photography. In this case, it is not necessary to check the contrast value different from the case of AF. It is only necessary that the CPU 180A simply issues a command that switches a lens between a macro position and an infinite (∞) position to the polymeric actuator driver circuit 170. The command is converted into a target voltage value in the polymeric actuator driver circuit 170, and the polymeric actuator 110 is driven to attain the target voltage value.

A driving method is not necessarily limited to PWM. Instead, a method that carries out control in such a manner that a constant voltage is simply applied to vary the voltage value and its application duration, a method that carries out control in such a manner that a constant electric current value is applied to vary the electric current value and its application duration, or the like, may be applied.

The embodiment of the invention is not limited to control for AF lens; the embodiment of the invention may be used for any control that uses a polymeric actuator.

As described above, according to the present embodiment, the polymeric actuator controller 200 includes the error amplifier 150 and the ADC 10, which serve as a potential difference reading unit that reads a potential difference that occurs between the terminals of the first electrode 114 and second electrode 115 of the polymeric actuator 110. The polymeric actuator controller 200 includes the polymeric actuator driver circuit 170 that applies a voltage to the first electrode 114 and second electrode 115 of the polymeric actuator 110 to drive the polymeric actuator 110. The polymeric actuator driver circuit 170 and the error amplifier 150 and ADC 160, which serve as the potential difference reading unit, form a closed loop. Then, the polymeric actuator driver circuit 170 varies a voltage that is applied so that the read potential value is maintained at the target potential value. Thus, according to the present embodiment, the following advantages may be obtained.

It is possible to further reliably carry out control as compared with an existing apparatus by identifying a displacement of the polymeric actuator. The movable range of the polymeric actuator may be limited, so it is possible to prevent breakage of the actuator and adverse influence on the actuator. It is possible to impose limitations so that an abnormal voltage or electric current is not applied to the actuator. It is possible to further stably maintain a displacement of the actuator. It is possible to set a load on the actuator to zero for a short period of time. Control is possible without a position sensor. Thus, it is possible to achieve low cost, light weight and small size. It is possible to carry out control even when the relationship between an applied voltage, an electric current and a displacement is not strictly clear.

The present application contains subject matter related to that disclosed in Japanese Priority Patent Application JP 2008-250927 filed in the Japan Patent Office on Sep. 29, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A polymeric actuator controller comprising:
a polymeric actuator that has a first electrode and a second electrode for applying electric energy to a polymeric portion and that displaces in accordance with applied electric energy;
a potential difference reading unit that reads a potential difference that occurs between terminals of the first electrode and second electrode of the polymeric actuator and generates a difference signal;
a polymeric actuator driver circuit that receives a parameter that indicates a target potential value and the difference signal, converts the parameter to the target potential value and applies the electric energy to the first electrode and second electrode of the polymeric actuator to drive the polymeric actuator in a continuously variable manner based on the target potential value and the difference value; and a control unit that supplies the polymeric actuator driver circuit with the parameter that indicates the target potential value and a command for driving the polymeric actuator, wherein, the polymeric actuator driver circuit and the potential difference reading unit form a closed loop, the control unit supplies the parameter and the command to the polymeric actuator from outside the closed loop, the polymeric actuator driver circuit varies the electric energy so that the potential difference read by the potential difference reading unit is maintained at the target potential value, the polymeric actuator driver circuit generates the electric energy that is applied to the first and second electrodes so as to vary the displacement of the polymeric actuator by changing the target potential difference in accordance with the command, the electric energy is applied as a rectangular wave signal, and the polymeric actuator drive circuit is configured to change a duty of the rectangular wave signal to control the displacement of the polymeric actuator.

2. The polymeric actuator controller according to claim 1, wherein the polymeric actuator driver circuit limits the target potential value into which the parameter value is converted to within a predetermined range.

3. The polymeric actuator controller according to claim 1 or claim 3, wherein, when the polymeric actuator is not used, the polymeric actuator driver circuit drives the polymeric actuator so that a potential difference between both terminals of the polymeric actuator is zero.

4. The polymeric actuator controller of claim 1, wherein the control unit is a data central processing unit, and the parameter that indicates a target potential value and the command are digital data signals.

5. A polymeric actuator control method comprising the steps of:

generating a parameter that indicates a potential target value and a command by means of a control unit;

supplying the parameter that indicates a target potential value and the command to a driver circuit;

converting the parameter that indicates a target potential value into a target potential value in the driver circuit and generating electrical energy to be applied to a polymeric actuator;

applying the electric energy to a first electrode and a second electrode of the polymeric actuator for applying the electric energy to a polymeric portion of the polymeric actuator to cause the polymeric actuator to displace in a continuously variable manner;

reading a potential difference that occurs between terminals of the first electrode and second electrode of the polymeric actuator and supply the potential difference to the driver circuit; and varying the electric energy so as to maintain the read potential difference at the target potential value, wherein, the electric energy is applied as a rectangular wave signal, and the driver circuit changes a duty of the rectangular wave signal to control the displacement of the polymeric actuator.

6. The polymeric actuator control method of claim 5, wherein the control unit is a data central processing unit, and the parameter that indicates a target potential value and the command are digital data signals.

7. An electronic apparatus comprising:

a movement control target portion; and a polymeric actuator controller that controls movement of the movement control target portion by controlling displacement of a polymeric actuator associated therewith, wherein, the polymeric actuator includes first and second electrodes disposed on opposite sides of a polymeric portion by means of which electric energy can be applied to the polymeric actuator to cause it to displace in accordance with the applied electric energy, the polymeric actuator includes (a) a potential difference reading unit that reads a potential difference that occurs between terminals of the first electrode and second electrode of the polymeric actuator, (b) a polymeric actuator driver circuit that applies the first electrode and second electrode of the polymeric actuator with the electric energy to drive the polymeric actuator in a continuously variable manner and generates a difference signal, and (c) a control unit that supplies the polymeric actuator driver circuit a parameter that indicates a target potential value and a command for driving the polymeric actuator, a polymeric actuator driver circuit that receives the command, the parameter that indicates a target potential value and the difference signal, converts the parameter to the target potential value and applies the electric energy to the first electrode and the second electrode of the polymeric actuator to drive the polymeric actuator based on the target potential value and the difference value, the polymeric actuator driver circuit and the potential difference reading unit form a closed loop, the polymeric actuator driver circuit varies the electric energy so that the potential difference read by the potential difference reading unit is maintained at a target potential value, the electric energy is applied as a rectangular wave signal, and the driver circuit is configured to change a duty of the rectangular wave signal to control the displacement of the polymeric actuator.

8. The electronic apparatus of claim 7, wherein the control unit is a data central processing unit, and the parameter that indicates a target potential value and the command are digital data signals.

9. A polymeric actuator controller comprising:

a polymeric actuator that has a first electrode and a second electrode for applying electric energy to a polymeric portion and that displaces in accordance with applied electric energy;

a potential difference reading unit that reads a potential difference that occurs between terminals of the first electrode and second electrode of the polymeric actuator and generates a difference signal;

a polymeric actuator driver circuit that receives a parameter that indicates a target potential value and the difference signal, converts the parameter to the target potential value and applies the electric energy to the first electrode and second electrode of the polymeric actuator to drive the polymeric actuator in a continuously variable manner based on the target potential value and the difference value; and a control unit that supplies the polymeric actuator driver circuit with the parameter that indicates the target potential value and a command for driving the polymeric actuator, wherein, the polymeric actuator driver circuit and the potential difference reading unit form a closed loop, the control unit supplies the parameter and the command to the polymeric actuator from outside the closed loop, the polymeric actuator driver circuit varies the electric energy so that the potential difference read by the potential difference reading unit is maintained at the target potential value, the polymeric actuator driver circuit generates the electric energy that is applied to the first and second electrodes so as to vary the displacement of the polymeric actuator by changing the target potential difference in accordance with the command, the electric energy is applied as a rectangular wave signal, and the polymeric actuator drive circuit turns the energy signal on and off in accordance with the duty to apply a desired driving voltage to the polymeric actuator.

10. A polymeric actuator control method comprising the steps of:

generating a parameter that indicates a potential target value and a command by means of a control unit;

supplying the parameter that indicates a target potential value and the command to a driver circuit;

converting the parameter that indicates a target potential value into a target potential value in the driver circuit and generating electrical energy to be applied to a polymeric actuator;

applying the electric energy to a first electrode and a second electrode of the polymeric actuator for applying the electric energy to a polymeric portion of the polymeric actuator to cause the polymeric actuator to displace in a continuously variable manner;

reading a potential difference that occurs between terminals of the first electrode and second electrode of the polymeric actuator and supply the potential difference to the driver circuit; and varying the electric energy so as to maintain the read potential difference at the target potential value, wherein, the electric energy is applied as a rectangular wave signal, and the driver circuit turns the energy signal on and off in accordance with the duty to apply a desired driving voltage to the polymeric actuator.

11. An electronic apparatus comprising:

a movement control target portion; and a polymeric actuator controller that controls movement of the movement control target portion by controlling displacement of a polymeric actuator associated therewith, wherein, the polymeric actuator includes first and second electrodes disposed on opposite sides of a polymeric portion by means of which electric energy can be applied to the polymeric actuator to cause it to displace in accordance with the applied electric energy, the polymeric actuator includes (a) a potential difference reading unit that reads a potential difference that occurs between terminals of the first electrode and second electrode of the polymeric actuator, (b) a polymeric actuator driver circuit that applies the first electrode and second electrode of the polymeric actuator with the electric energy to drive the polymeric actuator in a continuously variable manner and generates a difference signal, and (c) a control unit that supplies the polymeric actuator driver circuit a parameter that indicates a target potential value and a command for driving the polymeric actuator, a polymeric actuator driver circuit that receives the command, the parameter that indicates a target potential value and the difference signal, converts the parameter to the target potential value and applies the electric energy to the first electrode and the second electrode of the polymeric actuator to drive the polymeric actuator based on the target potential value and the difference value, the polymeric actuator driver circuit and the potential difference reading unit form a closed loop, the polymeric actuator driver circuit varies the electric energy so that the potential difference read by the potential difference reading unit is maintained at a target potential value, the electric energy is applied as a rectangular wave signal, and the polymeric actuator drive circuit turns the energy signal on and off in accordance with the duty to apply a desired driving voltage to the polymeric actuator.

* * * * *